US 6,653,851 B2

(12) United States Patent
Cugini et al.

(10) Patent No.: US 6,653,851 B2
(45) Date of Patent: Nov. 25, 2003

(54) REFOCUSING WAVELENGTHS TO A COMMON FOCAL PLANE FOR ELECTRICAL TRACE TESTING

(75) Inventors: Mario A. Cugini, Vista, CA (US); Jeff Brakley, San Diego, CA (US); Gilbert Norman Ravich, Lawndale, CA (US); Eric Ford, La Canada, CA (US)

(73) Assignee: Lomanoha Ventures, Vista, CA (US)

( * ) Notice: Subject to any disclaimer, the term of this patent is extended or adjusted under 35 U.S.C. 154(b) by 58 days.

(21) Appl. No.: 10/041,649

(22) Filed: Oct. 24, 2001

(65) Prior Publication Data

US 2003/0034788 A1 Feb. 20, 2003

Related U.S. Application Data

(63) Continuation-in-part of application No. 09/461,801, filed on Dec. 15, 1999, now Pat. No. 6,369,591, which is a continuation-in-part of application No. 09/231,410, filed on Jan. 14, 1999, now Pat. No. 6,369,590.

(51) Int. Cl.[7] ............................................. G01R 31/302
(52) U.S. Cl. ..................... 324/752; 356/369; 250/492.2
(58) Field of Search .............................. 324/752, 158.1, 324/751, 753; 250/492.2, 310; 156/345; 356/369; 438/8

(56) References Cited

U.S. PATENT DOCUMENTS

| 3,796,947 | A | * | 3/1974 | Harrod et al. ............... 324/501 |
| 4,721,910 | A | | 1/1988 | Bokor et al. ............. 324/158 R |
| 4,770,477 | A | | 9/1988 | Shafer ........................ 350/1.2 |
| 4,837,506 | A | * | 6/1989 | Patterson ..................... 324/752 |
| 4,845,425 | A | | 7/1989 | Beha et al. ............. 324/158 R |
| 4,967,152 | A | * | 10/1990 | Patterson ..................... 324/752 |
| 5,150,043 | A | | 9/1992 | Flesner ..................... 324/158 R |
| 5,260,578 | A | | 11/1993 | Bliton et al. ............. 250/461.1 |
| 5,563,508 | A | | 10/1996 | Tatah ....................... 324/158.1 |
| 5,640,099 | A | | 6/1997 | Sanada ........................ 324/752 |

(List continued on next page.)

FOREIGN PATENT DOCUMENTS

EP           0104577           4/1984

OTHER PUBLICATIONS

European Search Report (EP 00 10 8285).
*Photoelectric Phenomena*, Arthur Llewelyn Hughes, D. Sc., pp. 4–1 to 4–6, 1932.

(List continued on next page.)

*Primary Examiner*—Kamand Cuneo
*Assistant Examiner*—Jimmy Nguyen
(74) *Attorney, Agent, or Firm*—Wiggin & Dana LLP; Gregory S. Rosenblatt; Michael K. Kinney

(57) ABSTRACT

The present invention relates to a method and apparatus for testing electrical traces wherein ultraviolet wavelengths from a laser source and visible wavelengths from a scanning camera are focused to a common focal plane. In a first embodiment of the method and apparatus, the wavelengths are commonly focused using an auxiliary lens having a power sufficient to accommodate the difference between the focusing plane of the ultraviolet laser source and the scanning camera. In a second embodiment, the wavelengths are commonly focused by moving the camera optics of the scanning camera relative to its visible light source. Both of these methods and apparatuses employ a fused silica lens system, avoiding the use of calcium fluoride.

16 Claims, 3 Drawing Sheets

U.S. PATENT DOCUMENTS

| | | | |
|---|---|---|---|
| 5,661,408 A | 8/1997 | Kamieniecki et al. | 324/765 |
| 5,804,980 A | 9/1998 | Nikawa | 324/752 |
| 5,896,222 A | 4/1999 | Rosplock et al. | 395/355 |
| 5,969,883 A | 10/1999 | Yamakawa et al. | 359/779 |
| 6,011,402 A | 1/2000 | Kuo et al. | 324/753 |

OTHER PUBLICATIONS

"Photoemission from gold thin films for application in multiphotocathode arrays for electron beam lithography," Xinrong Jiang, C.N. Berglund, and Anthony E. Bell, William A. Mackie, *J. Vac. Sci. Technol.* B16(6), pp. 3375–3379, Nov./Dec. 1998.

*Optical Properties of Solids*, Frederick Wooten, pp. 8–11, 1972.

*Photomultiplier Handbook*, 1980 Edition, pp. 17–18.

"Fused–Silica Focusing Lens For Deep UV Laser Processing," Tuan–Yun Hung and Ching–Shen Su, *Applied Optics* 31 (22), pp. 4397–4404, Aug. 1992.

* cited by examiner

REFOCUSING WAVELENGTHS TO A COMMON FOCAL PLANE FOR ELECTRICAL TRACE TESTING

CROSS-REFERENCE TO RELATED APPLICATION

This patent application is a continuation-in-part of U.S. patent application Ser. No. 09/461,801 filed Dec. 15, 1999 now U.S. Pat. No. 6,369,591, which in turn is a continuation-in-part of U.S. patent application Ser. No. 09/231,410 filed Jan. 14, 1999 now U.S. Pat. No. 6,369,590, which are incorporated by reference herein in their entirety.

FIELD OF THE INVENTION

This invention relates to an apparatus and method of focusing two different wavelengths, such as wavelengths in the visible region (i.e., a camera) and in the ultraviolet region (i.e., a laser), to approximately the same focal plane. More particularly, this invention relates to an apparatus and method to test electrical traces wherein a visible wavelength and an ultraviolet wavelength are focused to a common focal plan.

BACKGROUND OF THE INVENTION

In applications where two or more wavelengths, such as ultraviolet light (200–400 nm) and visible light (500–600 nm), are focused to the same focal plane (i.e., correction of a chromatic aberration), a lens system of different transparent materials is used in lens construction. Conventionally, for ultraviolet and visible light systems, the materials of choice are calcium fluoride and silica. Because calcium fluoride is costly and difficult to obtain and does not provide adequate image quality, an alternative to the conventional lens system would be beneficial.

U.S. Pat. No. 4,770,477 to David R. Shafer, U.S. Pat. No. 5,260,578 to Bliton, et al., and U.S. Pat. No. 5,969,883 to Yamakawa, et al. disclose multiple element lens systems to correct for various imperfections, including chromatic aberrations. Each of these references disclose the use of at least one element made of costly calcium fluoride. These U.S. Patents are incorporated herein by reference in their entirety.

Commonly owned, co-pending U.S. patent application Ser. No. 09/231,410 (U.S. Ser. No. '410) and U.S. patent application Ser. No. 09/461,801 (U.S. Ser. No. '801), incorporated herein by reference in their entirety, describe a method and an apparatus, respectively, in which an achromatization alternative is necessary. These patent applications collectively disclose an apparatus and method in which electrical traces can be detected in a circuit board without physical contact or electrical connection. In the current manufacture of electronic systems, the packing density of system components has increased considerably, requiring extremely small circuit traces on the order of 0.002 to approximately 0.003 inches. Fabrication of these traces is difficult and defects such as opens or shorts are common. Therefore, testing the integrity of fine traces has become increasingly more important. Most conventional methods of trace testing involves physically contacting the trace with one or two test probes. The physical placement accuracy of test probes limit their use in testing in large quantities. Most significantly, the speed of testing is limited by the density of the traces and corresponding probes as well as the setting time. Many current traces are so small or densely packed that they can only be contacted individually with a physical probe in a very time consuming and uneconomical visual process.

U.S. Ser. No. '410 and U.S. Ser. No. '801 fulfill the need for a test method for fine traces in which the trace is not physically contacted and which is not unduly time consuming. The apparatus disclosed in U.S. Ser. No. '801 employs a camera (representing visible light) and an electromagnetic source (representing ultraviolet light) directed at the circuit board. For proper operation, the camera and electromagnetic wavelengths must be focused to substantially the same focal plane. Existing lens systems that fulfill this need often employ calcium fluoride elements and do not produce the image quality required for the proper and efficient operation of the testing system.

Accordingly, there exists a need for the development of a method and apparatus that achieves the same end result of the conventional calcium fluoride and fused silica lens system. More specifically, there exists a need for a method and apparatus that focuses two different wavelengths to a common focal plane with improved image quality.

SUMMARY OF THE INVENTION

Accordingly, an object of the present invention is to provide a method and apparatus for testing circuit boards wherein the scanning camera and the ultraviolet laser source are focused to a common focal plane.

The present invention is particularly useful in a tester for testing an electrical trace that provides for common focusing of an ultraviolet light source with a scanning camera using a fused silica objective scan lens. This system is generally described in commonly owned U.S. Ser. No. 09/231,410 and U.S. Ser. No. 09/461,801 and includes a scanning path camera sensitive to wavelengths in the visible region that is focused to a predetermined off-set. The scanning camera is directed toward the trace under test. An ultraviolet laser source is also directed at the test trace. A fused silica objective scan lens is placed in the path of the scanning camera and the ultraviolet laser source. For proper functioning, the two wavelengths (i.e., the ultraviolet wavelengths and the visible wavelength) must be substantially commonly focused on the board under test.

In a first embodiment, a method of testing an electrical trace is described. In this embodiment, an ultraviolet laser source is focused on a board having a test trace. A scanning camera sensitive to wavelengths in the visible region and focused to a predetermined off-set is directed at the test trace. An auxiliary lens is then placed in the path of the scanning camera prior to the introduction of the ultraviolet laser source. This auxiliary lens has a power sufficient to bring the camera into focus on the test trace. Accordingly, this auxiliary lens is chosen to have a power sufficient to accommodate the difference between the predetermined off-set and the test trace, taking into account the fused silica object scan lens which is placed in the path of the ultraviolet laser source and the scanning camera.

In a second embodiment of the present invention, the scanning camera and the ultraviolet laser source are commonly focused by shifting the camera optics until the focal plans agree. More specifically, an ultraviolet laser source is focused on a test trace. The scanning camera is focused to infinity and is directed at the test trace. A fused silica objective scan lens is placed in the path of the ultraviolet laser source and the scanning camera. The scanning camera has camera optics that may be moved independently of its visible light source. Accordingly, the scanning camera optics is moved relative to the camera's visible light source until the camera commonly focuses with the ultraviolet laser source at the test trace. One skilled in the art would recognize that the degree (e.g., the offset) that the camera optics is shifted depends on the dimensions of the overall system, particularly the objective scan lens placed in the path of the ultraviolet laser source and the scanning camera.

All of the embodiments above employ an objective scan lens system made entirely of fused silica. A preferred lens system useful in the present invention has an objective end and an opposing image end, and is comprised of, from the objective end to the image end:

a. a first substantially plano-convex lens element, with its substantially piano side adjacent the objective end having a first concave surface facing the objective end and a second convex surface facing the image end and wherein the ratio of the radius of curvature of the first concave to the radius of curvature of the second convex surface is between 9.5:1 and 11.5:1;

b. a second substantially plano-concave lens element, with its substantially piano side adjacent the objective end wherein the second lens is positioned proximate to the first lens element having a first concave surface facing the objective end and a second concave surface facing the image end and wherein the ratio of the radius of curvature of the first surface to the radius of the curvature of the second surface is between about 9:1 and 11:1;

c. a third substantially plano-convex lens element, with its substantially plano side adjacent the image end wherein the third lens element is positioned proximate to the second lens element having first convex surface facing the objective end and a second convex surface facing the image end and wherein the ratio of the radius of curvature of the first surface to the radius of curvature of the first surface to the radius of curvature of the second surface is between about 1:3.5 and 1:4.3; and, d. a fourth bi-concave lens element wherein the fourth lens element is positioned proximate to the third lens element having a first surface facing the objective end and a second surface facing the image end and wherein the ratio of the radius of curvature of the first surface to the radius of curvature of the second surface is between about 1:2.3 and 1:2.9, and wherein the first, second, third and fourth lens elements are sequentially aligned.

Other features and advantages of the invention will become more apparent upon a reading of the following detailed description together with the drawings in which like reference numerals refer to like parts.

DETAILED DESCRIPTION

Figure 1:
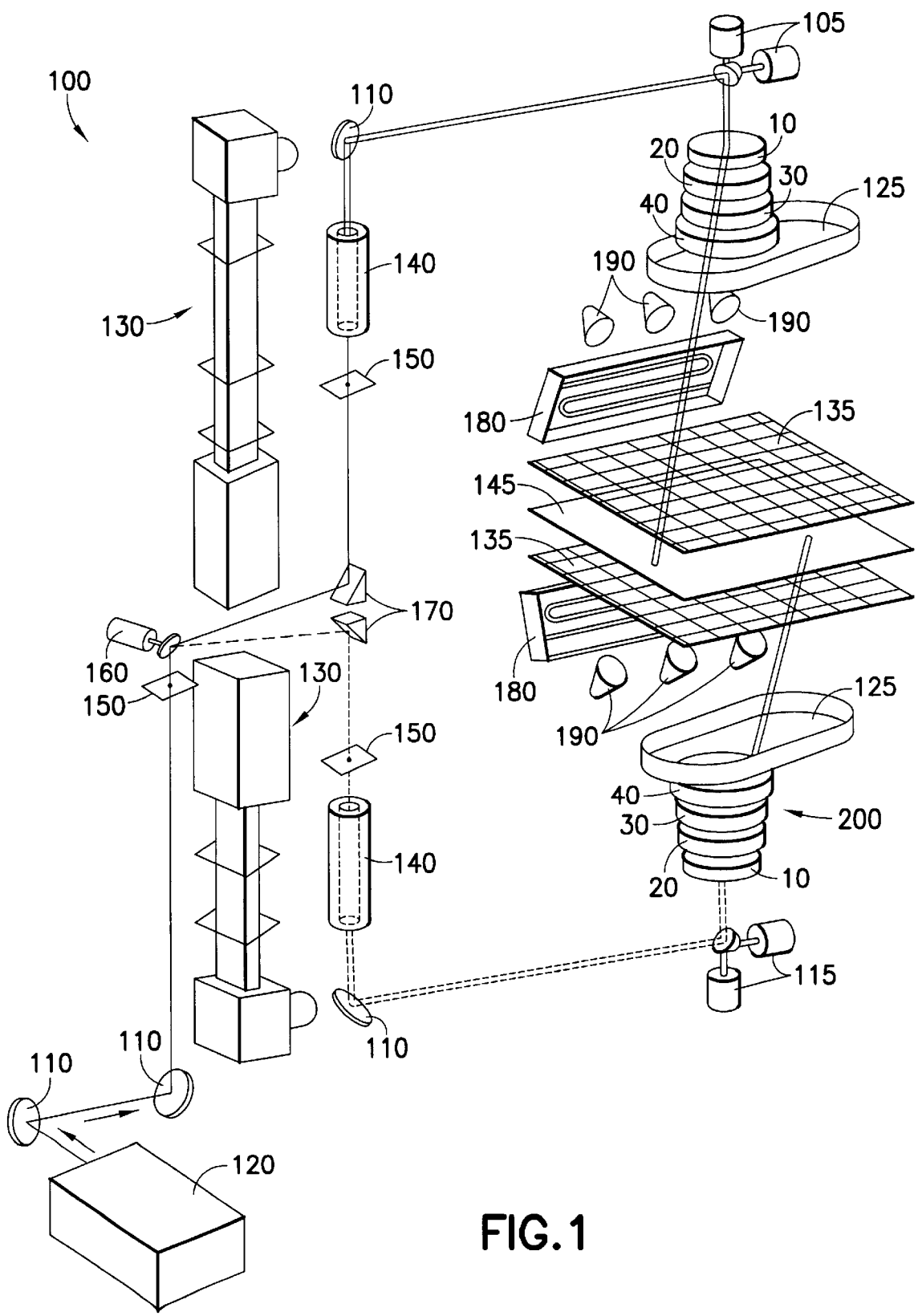
FIG. 1 is a schematic representation of the preferred application of the present invention.

The present invention describes a method and apparatus to test electrical traces wherein two different wavelengths are focused to substantially the same focal plane without requiring the use of calcium fluoride ($CaF_2$) lens elements. The disclosed method and apparatus result in enhanced image quality and increases the circuit board size that may be tested under the apparatus and method taught in U.S. Ser. No. '410 and U.S. Ser. No. '801.

Conventionally, two wavelengths are focused to the same focal plane by adding calcium fluoride elements to a fused silica lens system. The present invention performs this function without the need of calcium fluoride lens elements and creates a refocused camera lens in a non-collimated condition compensated for the chromatic focus difference of the fused silica laser ($SiO_2$) scan lens.

Conventional lens achromatization is a parabolic relationship between image location and wavelength wherein, the image location varies as a function of wavelength along a parabolic curve. When a lens with a spectral bandwidth less than approximately 50% of the shortest wavelength is achromatized, the amount of defocus and the rapidity of focus change as a function of wavelength are reasonably mild and within tolerable ranges such as 50 to 100 nm in the present application. However, when the spectral bandwidth is extremely broad (exceeding about 250% of the shortest wavelength), the parabola is very steep at the limits (near 257 nm and 575 nm) and the focus shifts very rapidly near these limits. The result is degraded image quality for broad spectral bandwidths near the limits.

As mentioned above, conventional lens achromatization requires the use of two different transparent materials, such as calcium fluoride and fused silica. Geometrical balance occurs when the positive lens constitution (or index of refraction) is offset a similar amount in the opposing direction by a negative lens element having a slightly different index of refraction. Because the negative lens elements are made of a different material than the positive elements (calcium fluoride and silica, respectively), this geometrical balance is achieved when select curvatures are employed in each of the elements. The present invention avoids this need for differing indices of refraction. Accordingly, a lens system made entirely of fused silica may be used.

In accordance with the present invention, the effective focal length of the first wavelength is shifted until the two wavelengths focus to a common focal plane. Therefore, the lens acts as a simple lens in which the blues are focused short and the reds are focused long. The rate of change of focus is such that, at F/65.5, the chromatically induced blur remains relatively small.

As will be discussed in more detail below, the refocusing shift can be performed either by adding an auxiliary lens in the path of one of the wavelengths, or by shifting the camera optics relative to the visible light source until the two wavelengths focus to a common focal plane. One skilled in the art would recognize that these two approaches are not mutually exclusive. A desirable affect may be achieved by using a combination of an auxiliary lens and shifting the camera optics.

While the described methods may be useful in any number of applications wherein two wavelengths are to be focused to the same focal plane, it is particularly useful in a system for testing an electrical trace, such as on a circuit board, without electrical connection to the test trace. One exemplary system is described in U.S. Ser. No. '410 and is depicted in FIG. 1. The test trace system 100 generally comprises an electromagnetic source 120, such as a laser for providing a beam of electromagnetic radiation directed on a single test trace for producing a photo-electric effect on the test trace liberating electrons from the trace, a collector disposed near the trace for collecting liberated electrons, and a collector circuit electrically connected to the collector for supplying a positive potential thereto and including a meter for measuring the photo-electric current to the collector from the trace. Preferably, the collector is a wire grid or a transparent sheet including a surface facing the test trace having a thin metal film thereon. Ideally, the trace and collector are placed in a vacuum chamber.

The electromagnetic source 120 provides a beam of electromagnetic radiation, such as a ultraviolet laser source, which is directed by two turning mirrors 110 upwards to a pinhole 150. After passing the pinhole, the ultraviolet beam strikes a small galvanometer 160 which can aim the beam either to the upper channel or the lower channel. The ultraviolet beam is reflected upwards by a small prism which acts a beam splitter 170. Prior to passing into the beam expander 140, the ultraviolet beam passes through an additional pinhole 150. The passage of the ultraviolet beam through the two pinholes 150 in combination with the motion of the stutter galvo 160 makes available a wide range of interrogating pulses used to gather data from the circuitry on the bare board.

In order to focus the ultraviolet beam to a smaller spot it is next expanded in the beam expander 140 and sent in to the turning mirror 110 which directs the expanded beam to the upper X, Y galvos 105 or the lower X, Y galvos 115. The galvos 105 are tied to a computer control system which can direct the ultraviolet laser beam to specific sites in the circuit board.

Preferably, the ultraviolet laser beam is focused at the commanded locations (or targets) by a laser scan objective lens system 200 (with elements 10, 20, 30, and 40) positioned proximate the vacuum window 125. Once into the vacuum chamber, the ultraviolet beam passes through the grid 135 which may be charged positive by a collector circuit in order to attract and capture released photoelectrons. Now at the target, the ultraviolet beam is tightly focused to a small spot giving high spacial resolution. The bare circuit board 145 is flood charged prior to the interrogation by a ultraviolet flood lamp 180. The electronic energy of the ultraviolet beam is such that it can eject electrons, or more correctly photoelectrons, from the surface of the circuit board 145 under test. These photogenerated electrons as well as the charged electrons are collected by the positive grid called a collector and analyzed to determine that the circuitry is correct and neither shorted or open. A meter is provided to measure the photo-electric current to the collector from the trace. All the while a visual CCD camera (i.e., a scanning laser path camera) with its associated optics 130 are viewing coaxially along the optical path joining the ultraviolet beam at the upper turning mirror and following along through the galvos 105 or 115, scan lens 200, vacuum window 125, grid 135, and focusing at the circuit board 145. The video image is used during initial alignment of the circuit board 145. Several halogen reflectorized lamps 190 are used to illuminate the board under test. The entire process can be repeated in the lower track as well as adding a second complete upper and lower scanning beam system operating adjacent to the schematic as shown. The fully operational four beam system can accelerate the entire test sequence.

Figure 2:
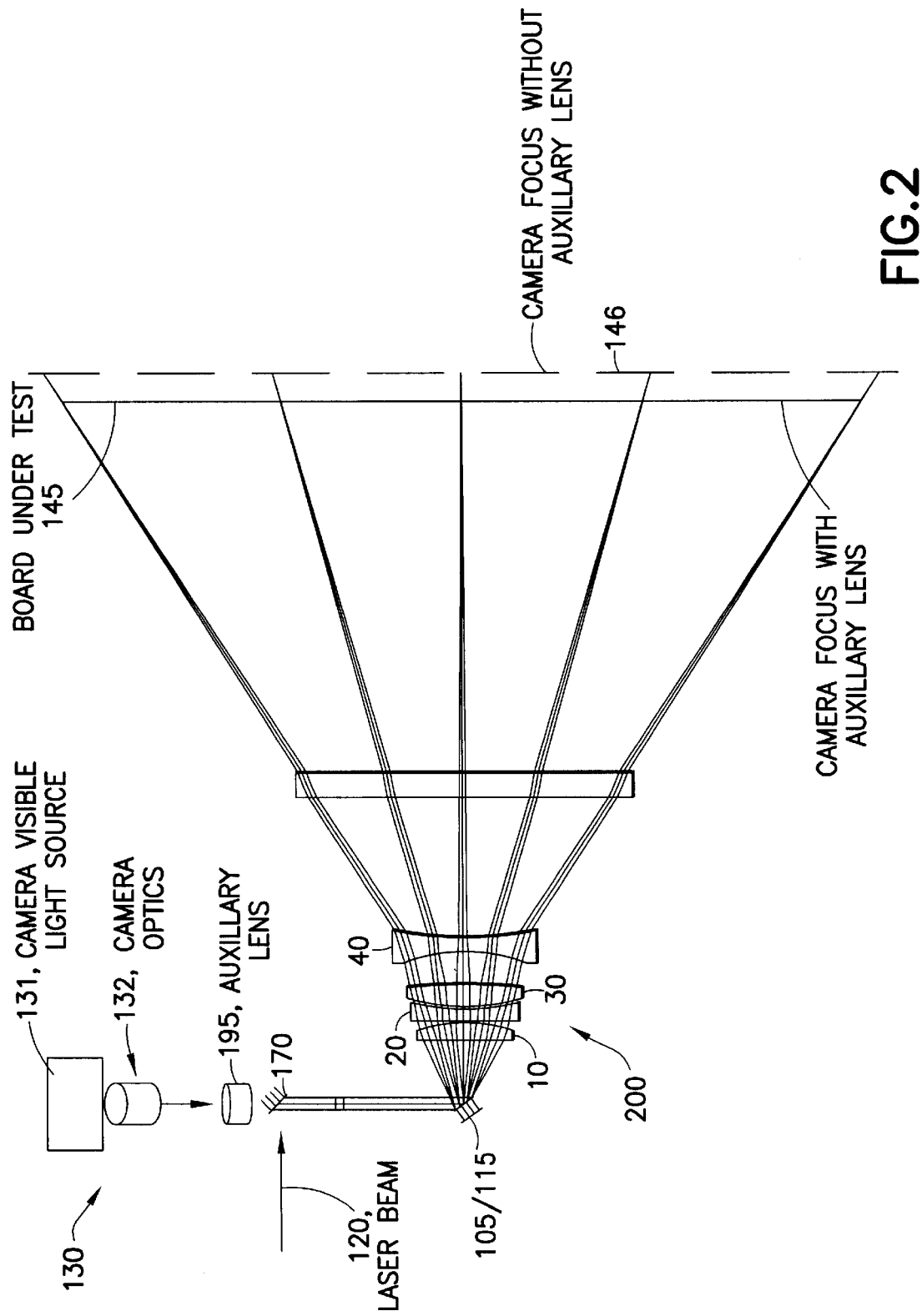
FIG. 2 is a schematic representation of the laser optical system and the camera optical system of the preferred application of the present invention.

FIG. 2 is a schematic of the laser optical system of the preferred application. Laser beam 120 enters the beam splitter 170 and is directed by a galvo scanner 105/115. through the scan lens system 200. The laser then hits the substrate where it energizes electrons to allow for testing of the board 145. Scanning camera 130 having a camera lens (also referred to as the camera optics) 131 is used to visually monitor the testing of the circuit board 145.

In this application, the two wavelengths that are to be commonly focused (at the target) are represented by the scanning camera (first wavelength) and the ultraviolet laser source (second wavelength). As can be seen in FIG. 2, with no correction, the scanning camera and the ultraviolet laser source converge at a plane 146 beyond the board under test 145. Preferably, the scanning camera is sensitive to wavelengths in the visible region while the electromagnetic source is an ultraviolet laser beam aimed at the target (i.e. trace on the board under test 145) to be tested. As can be seen in FIG. 2, with no correction, the scanning camera and the ultraviolet laser source coverage at a plane 146 beyond the target, e.g. the board under test 145.

In a first embodiment, the effective focal length may be shifted by focusing the scanning camera to a predetermined offset corresponding to the bandwidth and wavelength chosen for viewing and placing an auxiliary lens 195 in the path of the scanning camera. This auxiliary lens is chosen to have a power sufficient to shift the focal plane of the scanning camera to match the target (e.g., the circuit board under test). When the objective scan lens described below is used, this auxiliary lens preferably has a power (an effective focal length) between about +190 and about +210 mm, most preferably +200 mm.

In a second embodiment, a camera 130 having camera optics 132 that is movable relative to its visible light source 131 is focused to infinity. The camera optics 132 is then moved (e.g., the offset is adjusted) relative to the visual light source 131 until the ultraviolet light source and the camera focus to a common focal plane, e.g. the test trace. One skilled in the art would recognize that the movement (e.g., adjustment of the offset) of the camera optics is a trial and error movement that depends on the parameters and dimensions of the overall test system. For example, when the objective scan lens described below is used, this shift (or offset) is preferably between about +192 and about +200 inches, most preferably +196 inches (or $\frac{1}{5}$ of a diopter).

In the test tracer application, a lens focuses the camera so that any scan mirror employed will curve the image plane slightly and defocus the off-axis portions of the field being scanned (called a "field curving effect"). Preferably, the lens system (also referred to as the laser scan objective lens system) described below will operate even in the presence of this field curving effect. In essence, the lens system acts to compensate for the difference in power of the scan lens at the two wavelengths (266 nm versus 600 nm). The use of this lens system improves camera performance over a reasonably broad spectral band while maintaining acceptable magnitude even though the field curving effect is present.

Figure 3:
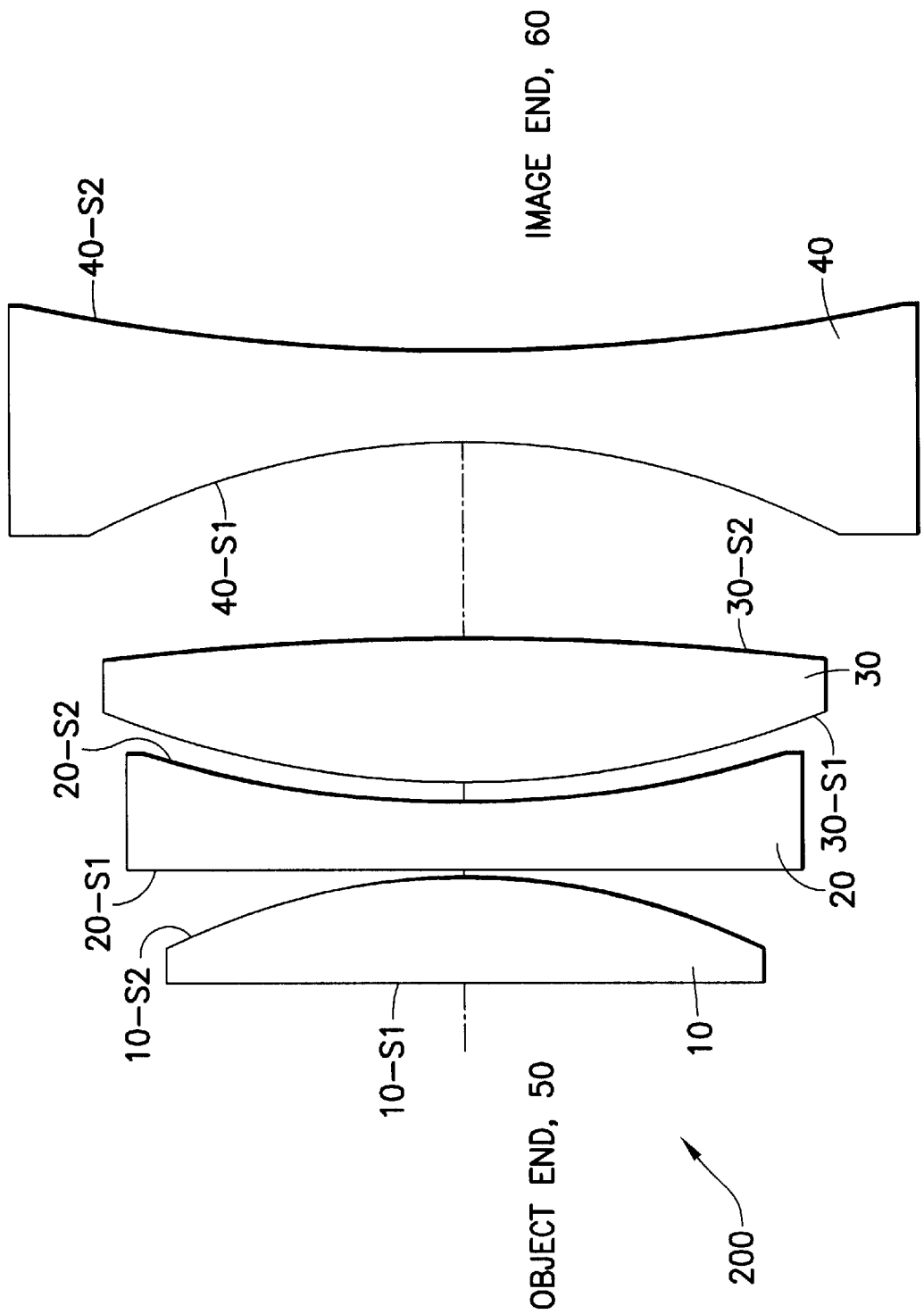
FIG. 3 depicts a four elements of the objective scan lens system useful in the present invention.

The lens system 200, as shown in FIG. 3, contains four elements all made of fused silica. Lens elements 10, 20, 30 and 40 are oriented sequentially from objective end 50 to image end 60. Ultraviolet laser beam of wavelengths, preferably between 200 and 400 nm, most preferably 266 nm, and visible wavelengths from the camera, preferably in the range of 500 to 600 nm, enter the objective end 50. The image end 60 is the target end and represents the direction of the common focal plane (e.g., the board under test).

As shown in FIG. 3, the four element system is comprised of: (1) the first element 10 is a substantially plano-convex lens, (2) the second element 20 is a substantially plano-concave lens, (3) the third element 30 is a substantially plano-convex lens, and (4) the fourth element 40 is a biconcave lens. The first element 10 has a first surface 10-S1 on the objective end and a second surface 10-S2 on the image end. The ratio of the radius of curvature of the first surface 10-S1 to the radius of curvature of the second surface 10-S2 should be between 9.5:1 and 11.5:1, wherein the radius of curvature of the first surface 10-S1 is concave and the radius of curvature of the second surface 10-S2 is convex. Preferably, the ratio should be between 10:1 and 11:1 and, most preferably, 10.5:1.

The second element 20 has a first surface 20-S1 on the objective end and a second surface 20-S2 on the image end. The ratio of the radius of curvature of the first surface 20-S1 to the radius of curvature of the second surface 20-S2 should be between 9:1 and 11:1, wherein the radius of curvature of the first 20-S1 and second 20-S2 surfaces are concave. Most preferably, this ratio should be 10.1:1.

The third element 30 has a first surface 30-S1 on the objective end and a second surface 30-S2 on the image end. The ratio of the radius of curvature of the first surface 30-S1 to the radius of curvature of the second surface 30-S2 should be between 1:3.5 and 1:4.3, wherein the radius of curvature of the first surface 30-S1 is convex and the radius of curvature of the second surface 30-S2 is convex. Most preferably, this ratio should be 1:3.94.

The fourth element 40 has a first surface 40-S1 on the objective end and a second surface 40-S2 on the image end. The ratio of the radius of curvature of the first surface 40-S1 to the radius of curvature of the second surface 40-S2 should be between 1:2 and 1:3, wherein the radius of curvature of the first surface 40-S1 is concave and the radius of curvature of the second surface 40-S2 is concave. Most preferably, this ratio should be 1:2.61.

In the preferred embodiment, as shown in FIG. 3, lens element 10 has a radius of curvature of the first surface 10-S1 approximately 39.37 inches ±0.100 inches concave while the radius of curvature of the second surface is approximately 3.7598 inches ±0.001 inches convex. Further, the power of this element should be approximately 5 and the irregularity should be about 2. In addition, the clear aperture (CA) diameter should be between 3.0 and 3.5 inches, preferably about 3.240 inches, for the first surface 10-S1 and about 3.380 inches for the second surface 10-S2. The edge diameter should be about 3.700 inches with a tolerance of about +0.000 inches and −0.001 inches. The central thickness should be about 0.600 inches ±0.010 inches. Further, lens element 10 should be a wedge with a total internal reflection (TIR) of about 0.005. The diameter to flat of element 10 is ideally between 3.2 and 3.6 inches, preferably 3.460 inches (REF), with a surface sagitta (sag) of 0.038 inches ±0.001 inches on the first surface 10-S1.

As shown in FIG. 3, the preferred embodiment of the second lens element 20 has a radius of curvature of the first surface 20-S1 approximately 66.61 inches ±0.080 inches concave while the radius of curvature of the second surface 20-S2 is approximately 6.5950 inches ±0.001 inches concave. Like the first element, the second element 20 should have a power of about 5 and an irregularity of about 2. The CA diameter should be between 3.5 and 4.0 inches, preferably about 3.800 inches, for the first surface 20-S1 and between 3.6 and 4.2 inches, preferably 3.900 inches, for the second surface 20-S2. The edge diameter should be about 4.340 inches +0.000 and −0.001 inches. The central thickness of element 20 should be about 0.400 inches ±0.003 inches. Lens element 20 should be a wedge with a TIR of 0.0005. The diameter to flat is ideally between 3.0 and 5.0 inches (REF), preferably 4.000 (REF), with surface sag of 0.030 inches ±0.001 inches on the first surface and 0.305 inches ±0.001 inches on the second surface 20-S2. The diameter to flat is approximately between 3.8 and 4.2 inches (REF), preferably 4.000 inches (REF), with a surface sag of approximately 0.030 inches ±0.001 inches on surface 20-S1 and 0.3105 inches ±0.001 inches on surface 20-S2.

As shown in FIG. 3, ideally the third lens element 30 has a radius of curvature of the first surface 30-S1 approximately 5.7064 inches ±0.001 inches convex and the radius of curvature of the second surface 30-S2 is between 20 and 25 inches, preferably 22.5 inches, convex. The third element 30 should also have a power of 5 and irregularity of 2. The CA diameter should be between 3 and 4.5 inches, preferably 4.04 inches, for the first surface 30-S1 between 3.5 and 4.5 inches, preferably 4.14 inches, for the second surface 30-S2. The edge diameter should be about 4.340 inches +0.000 inches and −0.001 inches. The central thickness should be about 0.800 inches ±0.003. Element 30 should be a wedge with a TIR of 0.0005.

As shown in FIG. 3, ideally the fourth lens element 40 has a radius of curvature of the first surface 40-S1 equal to between 4 and 5.2 inches, preferably 4.7198 inches, concave TPF and a radius of curvature of the second surface 40-S2 equal to between 12 and 12.5 inches, preferably 12.3250 inches, concave TPF. The fourth lens 40 should have a power of 5 and an irregularity of 2. The CA diameter should be between 4 and 5 inches, preferably 4.5 inches, for the first surface 40-S1 and between 5 and 5.5 inches, preferably 5.180 inches, for the second surface 40-S2. The edge diameter should be about 5.400 inches +0.000 inches and −0.001 inches. The central thickness should be about 0.500 inches ±0.003 inches. The element should be a wedge with a TIR of 0.0005. The diameter to flat is between 4–6 inches, preferably 5.0 inches, (REF) with a surface sag of approximately 0.7615 inches +0.001 inches on surface 40-S1 and between 5 and 5.5 inches, preferably 5.2 inches, (REF) with a sag of approximately 0.2774 inches ±0.001 inches on surface 40-S2.

Ideally, lens elements 10, 20, 30 or 40 should be manufactured in accordance with MIL-O-13830B of ultraviolet grade fused silica with a homogenity grade A, bubble grade 1, and Nd±0.001. The surfaces 10-S1, 10-S2, 20-S1, 20-S2, 30-S1, 30-S2, 40-S1, and 40-S2 should be polished, while all other surfaces may be fine grind. The surface quality of these elements should be 40-20 scratch-dig with a surface roughness of less than or equal to 20 angstroms as calculated by the root-mean-square (RMS) method. Surfaces 10-S1, 10-S2, 20-S1, 20-S2, 30-S1, 30-S2, 40-S1, and 40-S2 should be coated with a dielectric multi-layer anti-reflective (MLAR) coating for reflection less than 1.0% for the ultraviolet wavelengths and reflection less than 0.75% for the visible region from normal incidence to 25 degrees. Laser damage threshold in the ultraviolet region should be greater than or equal to approximately 250 watts/cm$^2$. In designing lens elements for the preferred embodiment, the reference wavelength for power and irregularity fringes was 546 nm. All sharp edges should be broken for maximum 0.020 inches face width. The lens system 100 should be diffraction limited for the wavelengths involved, in the case as described below, the laser beam and the camera. One skilled in the art will recognize that some of these criteria may be adjusted depending on the function of the lens system, i.e., what wavelengths are to be refocused to common focal planes.

In order to "parfocalize" the lens elements, the internal airspace next to the largest element may need adjustment. For example, a 0.0010 inch increase in this space will result in a 0.135 inch decrease in the BFL of the system. The tolerances may result in a variation of about 0.22 inches in BFL so that an adjustment of ±0.015 inches for this space is recommended. Further, an increase of this adjustment to ±0.020 inches is recommended, if possible.

The CA diameter of the input (first) element should be between 7% and 9%, most preferably 8%, of the radius of the curvature of the first surface of the first lens element 10-S1 and the CA diameter of the output (fourth) element should be between 36% and 45%, most preferably 41%, of the radius of curvature of the second surface of the fourth lens element 40-S2.

The first 10 and fourth 40 elements perform most of the bending and focusing while the second 20 and third 30 elements balance the monochromatic aberrations at the boundary between them.

Because the lens system was originally developed for use in a trace tester, as taught in U.S. Ser. No. '410 and discussed below, a preferred embodiment of the laser scan objective lens system was designed to meet the criteria as outlined in Table 1.

TABLE 1

Trace Tester Parameters

| | |
|---|---|
| Configuration | In-line scan objective lens |
| Spectral Band | Laser: 200–400 nm |
| | Camera (visible): 500–600 nm |
| Focal Length | 26.2 in. |
| Scan Area Format | Centered System: 16 in. × 16 in. (22.6 in. diagonal) |
| | Dual Scan System: 26.8 in. diagonal |
| Scan Angle (Composite) | Centered System: +/−23.3° |
| | Dual Scan System: +/−27° |
| Length (Camera to Image) | 24.6 in. |
| Laser Spot Size | Minimize (goal < 0.0025 in.) |
| Window Material | Fused silica, 0.875 in thick |
| Lens Material | Fused silica |
| Lens Diameter | Minimize* |

*The maximum diameter of any one lens element is approximately 5.1 in.

One skilled in the art would recognize that one or more of these parameters may be adjusted to meet the needs of the application employing the lens system without detracting from the lens system function.

Thus, there has been shown and described a method to focus two wavelengths to a common focal plane or target without the need for a lens for a lens system having $CaF_2$ element. Instead, an all fused silica lens system can be used. There has also been described one useful application of such a method and fused silica lens system. Other embodiments and modifications may be useful without detracting from the overall purpose of this invention. In addition, there are many other applications of this invention, other than that described herein. Any such modifications and applications recognized by one skilled in the art is intended to fall within the scope of this application.

What is claimed is:

1. A method of testing an electrical trace, comprising:
   a. providing a board having a test trace;
   b. focusing an ultraviolet laser source on said test trace at a first focal plane;
   c. directing a scanning camera sensitive to wavelengths in the visible region at the test trace, wherein said scanning camera is focused to a predetermined off-set;
   d. placing an objective scan lens comprised of fused silica in the path of the ultraviolet laser source and the scanning camera; and
   e. placing an auxiliary lens in the path of the scanning camera prior to the introduction of the ultraviolet laser source, wherein the auxiliary lens has a power sufficient to accommodate the difference between said predetermined off-set and said first focal plane.

2. The method of claim 1, wherein said objective scan lens has an objective end and an opposing image end comprised of from objective end to image end:
   a. a first substantially plano-convex lens element, with its substantially piano side adjacent the objective end, having a first concave surface facing the objective end and a second convex surface facing the image end and wherein the ratio of the radius of curvature of the first concave to the radius of curvature of the second convex surface is between 9.5:1 and 11.5:1;
   b. a second substantially plano-concave lens element, with its substantially plano side adjacent the objective end wherein said second lens is positioned proximate to said first lens element, having a first concave surface facing the objective end and a second concave surface facing the image end and wherein the ratio of the radius of curvature of the first surface to the radius of the curvature of the second surface is between about 9:1 and 11:1;
   c. a third substantially plano-convex lens element, with its substantially piano side adjacent the image end wherein said third lens element is positioned proximate to said second lens element, having first convex surface facing the objective end and a second convex surface facing the image end and wherein the ratio of the radius of curvature of the first surface to the radius of curvature of the first surface to the radius of curvature of the second surface is between about 1:3.5 and 1:4.3; and
   d. a fourth biconcave lens element wherein said fourth lens element is positioned proximate to said third lens element, having a first surface facing the objective end and a second surface facing the image end and wherein the ratio of the radius of curvature of the first surface to the radius of curvature of the second surface is between about 1:2.3 and 1:2.9, wherein said first, second, third and fourth lens elements are sequentially aligned.

3. The method of claim 2, wherein said auxiliary lens has an effective focal length approximately equal to between about +190 mm and about +210 mm.

4. The method of claim 3, wherein said auxiliary lens has an effective focal length equal to +200 mm.

5. A method of testing an electrical trace, comprising:
   a. providing a board having a test trace;
   b. focusing an ultraviolet laser source on said test trace;
   c. directing a scanning camera sensitive to wavelengths in the visible region at the test trace, wherein said camera is focused to infinity and wherein said camera has camera optics that may be moved independently of its visible light source;
   d. placing an objective scan lens comprised of fused silica in the path of the ultraviolet laser source and the scanning camera; and
   e. adjusting the camera optics relative to the visible light source until the scanning camera offset is such that said camera commonly focuses with the ultraviolet laser source at the test trace.

6. The method of claim 5, wherein said objective scan lens has an objective end and an opposing image end comprised of from objective end to image end:
   a. a first substantially plano-convex lens element, with its substantially plano side adjacent the objective end, having a first concave surface facing the objective end and a second convex surface facing the image end and wherein the ratio of the radius of curvature of the first concave to the radius of curvature of the second convex surface is between 9.5:1 and 11.5:1;
   b. a second substantially plano-concave lens element, with its substantially piano side adjacent the objective end wherein said second lens is positioned proximate to said first lens element, having a first concave surface facing the objective end and a second concave surface facing the image end and wherein the ratio of the radius of curvature of the first surface to the radius of the curvature of the second surface is between about 9:1 and 11:1;

c. a third substantially plano-convex lens element, with its substantially plano side adjacent the image end wherein said third lens element is positioned proximate to said second lens element, having first convex surface facing the objective end and a second convex surface facing the image end and wherein the ratio of the radius of curvature of the first surface to the radius of curvature of the first surface to the radius of curvature of the second surface is between about 1:3.5 and 1:4.3; and d. a fourth bi-concave lens element wherein said fourth lens element is positioned proximate to said third lens element, having a first surface facing the objective end and a second surface facing the image end and wherein the ratio of the radius of curvature of the first surface to the radius of curvature of the second surface is between about 1:2.3 and 1:2.9, wherein said first, second, third and fourth lens elements are sequentially aligned.

7. The method of claim 6, wherein said offset of said camera optics is equal to between about +192 and +200 inches.

8. The method of claim 7, wherein said offset of said camera optics is equal to +196 inches.

9. A tester for testing an electrical trace, comprised of:

a. a scanning path camera sensitive to wavelengths in the visible region, wherein said camera is focused to a predetermined off-set and is directed at a test trace;

b. an ultraviolet laser source directed on said test trace at a first focal plane;

c. an objective scan lens comprised of fused silica placed in the path of the ultraviolet laser source and the scanning camera; and d. an auxiliary lens positioned in the path of the scanning camera prior to the introduction of the ultraviolet laser source, wherein the auxiliary lens has a power sufficient to accommodate the difference between said predetermined off-set and said first focal plane.

10. The tester of claim 9, wherein said objective scan lens, has an objective end and an opposing image end, and is comprised of, from said objective end to said image end:

a. a first substantially plano-convex lens element, with its substantially piano side adjacent the objective end having a first concave surface facing the objective end and a second convex surface facing the image end and wherein the ratio of the radius of curvature of the first concave to the radius of curvature of the second convex surface is between 9.5:1 and 11.5:1;

b. a second substantially plano-concave lens element, with its substantially plano side adjacent the objective end wherein said second lens is positioned proximate to said first lens element having a first concave surface facing the objective end and a second concave surface facing the image end and wherein the ratio of the radius of curvature of the first surface to the radius of the curvature of the second surface is between about 9:1 and 11:1;

c. a third substantially plano-convex lens element, with its substantially piano side adjacent the image end wherein said third lens element is positioned proximate to said second lens element having first convex surface facing the objective end and a second convex surface facing the image end and wherein the ratio of the radius of curvature of the first surface to the radius of curvature of the first surface to the radius of curvature of the second surface is between about 1:3.5 and 1:4.3; and d. a fourth bi-concave lens element wherein said fourth lens element is positioned proximate to said third lens element having a first surface facing the objective end and a second surface facing the image end and wherein the ratio of the radius of curvature of the first surface to the radius of curvature of the second surface is between about 1:2.3 and 1:2.9, wherein said first, second, third and fourth lens elements are sequentially aligned.

11. The tester of claim 10, wherein said auxiliary lens has an effective focal length of between about +190 mm and +210 mm.

12. The tester of claim 11, wherein said auxiliary lens has an effective focal length of +200 mm.

13. A tester for testing an electrical trace, comprised of:

a. a scanning path camera sensitive to wavelengths in the visible region directed to a test trace, wherein said camera is focused to infinity and wherein said camera has camera optics that may be moved independently of its visible light source;

b. an ultraviolet laser source directed on said test trace; and c. an objective scan lens comprised of fused silica placed in the path of the ultraviolet laser source and scanning camera.

14. The tester of claim 13, wherein said objective scan lens, has an objective end and an opposing image end, and is comprised of, from said objective end to said image end:

a. a first substantially plano-convex lens element, with its substantially plano side adjacent the objective end having a first concave surface facing the objective end and a second convex surface facing the image end and wherein the ratio of the radius of curvature of the first concave to the radius of curvature of the second convex surface is between 9.5:1 and 11.5:1;

b. a second substantially plano-concave lens element, with its substantially plano side adjacent the objective end wherein said second lens is positioned proximate to said first lens element having a first concave surface facing the objective end and a second concave surface facing the image end and wherein the ratio of the radius of curvature of the first surface to the radius of the curvature of the second surface is between about 9:1 and 11:1;

c. a third substantially plano-convex lens element, with its substantially piano side adjacent the image end wherein said third lens element is positioned proximate to said second lens element having first convex surface facing the objective end and a second convex surface facing the image end and wherein the ratio of the radius of curvature of the first surface to the radius of curvature of the first surface to the radius of curvature of the second surface is between about 1:3.5 and 1:4.3; and d. a fourth bi-concave lens element wherein said fourth lens element is positioned proximate to said third lens element having a first surface facing the objective end and a second surface facing the image end and wherein the ratio of the radius of curvature of the first surface to the radius of curvature of the second surface is between about 1:2.3 and 1:2.9, wherein said first, second, third and fourth lens elements are sequentially aligned.

15. The tester of claim 14, wherein said camera optics is focused to an offset equal to between about +192 inches and about +200 inches.

16. The tester of claim 15, wherein said camera optics is focused to an offset equal to +196 inches.

* * * * *